(12) United States Patent
Jo et al.

(10) Patent No.: US 12,484,383 B2
(45) Date of Patent: Nov. 25, 2025

(54) DISPLAY DEVICE

(71) Applicant: Samsung Display Co., Ltd., Yongin-Si (KR)

(72) Inventors: Kangmoon Jo, Hwaseong-si (KR); Unbyoll Ko, Hwaseong-si (KR); So-Woon Kim, Suwon-si (KR); Jungbae Song, Seongnam-si (KR); Ansu Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 751 days.

(21) Appl. No.: 17/857,950

(22) Filed: Jul. 5, 2022

(65) Prior Publication Data

US 2023/0011831 A1 Jan. 12, 2023

(30) Foreign Application Priority Data

Jul. 6, 2021 (KR) .......................... 10-2021-0088639

(51) Int. Cl.
*H10K 59/122* (2023.01)
*H10K 59/38* (2023.01)

(52) U.S. Cl.
CPC ........... *H10K 59/122* (2023.02); *H10K 59/38* (2023.02)

(58) Field of Classification Search
CPC ............................. H10K 59/122; H10K 59/38
See application file for complete search history.

(56) References Cited

U.S. PATENT DOCUMENTS

| | | | |
|---|---|---|---|
| 2017/0294491 A1 | 10/2017 | Jo et al. | |
| 2017/0307898 A1* | 10/2017 | Vdovin | H04N 13/307 |
| 2020/0381489 A1* | 12/2020 | Hwang | H10K 59/121 |
| 2022/0013587 A1* | 1/2022 | Jo | H10K 59/38 |
| 2022/0223654 A1 | 7/2022 | Ryu et al. | |

FOREIGN PATENT DOCUMENTS

| | | |
|---|---|---|
| CN | 107113418 B | 3/2020 |
| KR | 10-2005-0073652 A | 7/2005 |
| KR | 10-2018-0014807 A | 2/2018 |
| KR | 10-2020-0135727 A | 12/2020 |
| KR | 10-2022-0006160 A | 1/2022 |

* cited by examiner

*Primary Examiner* — Mary Ellen Bowman
(74) *Attorney, Agent, or Firm* — Innovation Counsel LLP

(57) ABSTRACT

A display device is disclosed that includes a base substrate in which a first pixel area, a second pixel area, a third pixel area, and a light blocking area are defined. First, second, and third emission elements are disposed on the base substrate in the first, second, and third pixel areas, respectively. A color conversion layer includes a first color conversion pattern, a second color conversion pattern, and a light transmission pattern disposed on the first, second, and third emission elements, respectively. A color filter layer includes first, second, and third color filters disposed on the first color conversion pattern, the second color conversion pattern, and the light transmission pattern, respectively. The second pixel area is spaced apart from the first pixel area by a first interval. The third pixel area is spaced from the first pixel area by a second interval smaller than the first interval. The third pixel area is spaced from the second pixel area by a third interval larger than the second interval. The light blocking area surrounds each of the first, second, and third pixel areas.

20 Claims, 5 Drawing Sheets

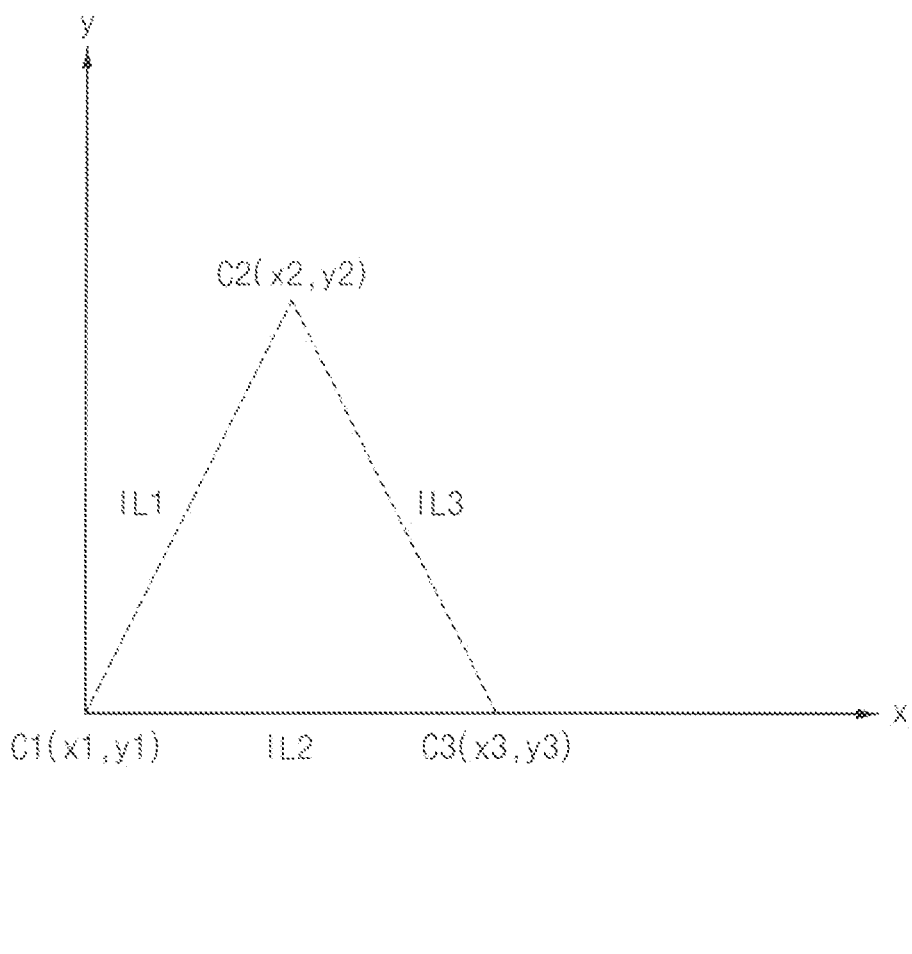

DISPLAY DEVICE

CROSS-REFERENCE TO RELATED APPLICATION

This application claims priority from and the benefit of Korean Patent Application No. 10-2021-0088639, filed on Jul. 6, 2021, which is hereby incorporated by reference for all purposes as if fully set forth herein.

BACKGROUND

1. Field

The present inventive concept relates to a display device. More particularly, the present inventive concept relates to a display device providing visual information.

2. Description of the Related Art

In recent years, a flat panel display ("FPD") having a large area and capable of being thin and light has been widely used as a display device. As the flat panel display, a liquid crystal display device ("LCD"), a plasma display panel display panel ("PDP"), an organic light emitting display device ("OLED"), and the like are used.

Meanwhile, a display device including a color conversion layer and a color filter layer has been proposed to realize a display device having excellent color reproducibility and high luminance. The color filter layer may be disposed in a pixel area displaying an image. However, as a peripheral value of the pixel area in which the color filter layer is disposed increases, the display quality of the display device may deteriorate.

SUMMARY

Embodiments of a display device may provide a display device with improved display quality.

A display device according to an embodiment may include a first base substrate in which a first pixel area, a second pixel area, a third pixel area and a light blocking area are defined, first, second, and third emission elements disposed on the first base substrate in the first, second, and third pixel areas, respectively, a color conversion layer including a first color conversion pattern, a second color conversion pattern, and a light transmission pattern disposed on the first, second, and third emission elements, respectively, and a color filter layer including first, second, and third color filters disposed on the first color conversion pattern, the second color conversion pattern, and the light transmission pattern, respectively. The second pixel area may be spaced apart from the first pixel area by a first interval. The third pixel area may be spaced from the first pixel area by a second interval smaller than the first interval. The third pixel area may be spaced from the second pixel area by a third interval larger than the second interval. The light blocking area may surround each of the first, second, and third pixel areas.

In an embodiment, each of the first, second, and third pixel areas may be repeatedly arranged in a row direction and a column direction in a plan view.

In an embodiment, the first, second, and third pixel areas and the light blocking area may be defined as a display area. The second pixel may be repeatedly arranged in a first row of the display area. The first pixel area and the third pixel area may be alternately arranged in a second row of the display area and the second row may be adjacent to the first row.

In an embodiment, the first pixel area may emit a first light, the second pixel area may emit a second light having a color different from a color of the first light, and the third pixel area may emit a third light having a color different from a color of the first light and a color of the second light.

In an embodiment, the first light may be a red light, the second light may be a green light, and the third light may be a blue light.

In an embodiment, each of the first, second, and third pixel areas may have a hexagonal shape in a plan view.

In an embodiment, each of the first, second, and third pixel areas may have a regular hexagon shape in a plan view.

In an embodiment, a length of a first virtual line connecting a center of the first pixel area and a center of the second pixel area may be a same as a length of a second virtual line connecting a center of the second pixel area and a center of the third pixel area.

In an embodiment, first to third virtual lines connecting a center of each of the first, second, and third pixel areas may have a triangular shape in a plan view.

In an embodiment, the first to third virtual lines connecting a center of each of the first, second, and third pixel areas may have an isosceles triangle shape in a plan view.

In an embodiment, the display device may further include a filing layer disposed between the emission element and the color conversion layer and a second base substrate disposed on the color filter layer.

In an embodiment, the display device may further include a light blocking layer disposed in the light blocking area between the color conversion layer and the second base substrate.

In an embodiment, the display device may further include a bank layer disposed in the light blocking area between the first color conversion pattern, the second color conversion pattern, and the light transmission pattern on the filing layer.

In an embodiment, the emission element may include a blue emission element emitting a blue light.

In an embodiment, an area of the third pixel area may be smaller than an area of each of the first and second pixel areas.

A display device according to an embodiment may include a base substrate in which a first pixel area, a second pixel area, a third pixel area, and a light blocking area surrounding the first, second, and third pixel areas are defined, first, second, and third emission elements disposed on the base substrate in the first, second, and third pixel areas, a color conversion layer including a first color conversion pattern, a second color conversion pattern, and a light transmission pattern disposed the first, second, and third emission elements, respectively, a color filter layer including first to third color filters dispose on each of the first color conversion pattern, the second color conversion pattern, and the light transmission pattern and a light blocking layer disposed in the light blocking area between the first to third color filters. The light blocking layer may include a first opening overlapping the first pixel area, a second opening overlapping the second pixel area and spaced apart from the first opening by a first interval, and a third opening overlapping the third pixel area and spaced apart from the first opening by a second interval smaller than the first interval, the third opening spaced apart from the second opening by a third interval larger than the second interval.

In an embodiment, the first, second, and third pixel areas and the light blocking area may define a display area. The second opening may be repeatedly arranged in a first row of the display area. The first opening and the third opening may be alternately arranged in a second row of the display area. The second row may be adjacent to the first row.

In an embodiment, the first pixel area may emit a red light, the second pixel area may emit a green light, and the third pixel area may emit a blue light.

In an embodiment, each of the first to third openings may have a regular hexagon shape in a plan view.

In an embodiment, the emission element may include a blue emission element emitting a blue light.

In the display device according to an embodiment, a second pixel area emitting a green light may be spaced apart from a first pixel area emitting a red light by a first interval. In addition, a third pixel area emitting a blue light may be spaced apart from the first pixel area by a second interval smaller than the first interval. The third pixel area may be spaced apart from the second pixel area by a third interval greater than the second interval. Accordingly, a display quality of the display device may be improved.

BRIEF DESCRIPTION OF THE DRAWINGS

Illustrative, non-limiting embodiments will be more clearly understood from the following detailed description in conjunction with the accompanying drawings.

FIG. 7 is a diagram for explaining numerical values of first to third pixel areas of FIG. 6.

DETAILED DESCRIPTION OF THE EMBODIMENTS

Figure 1:
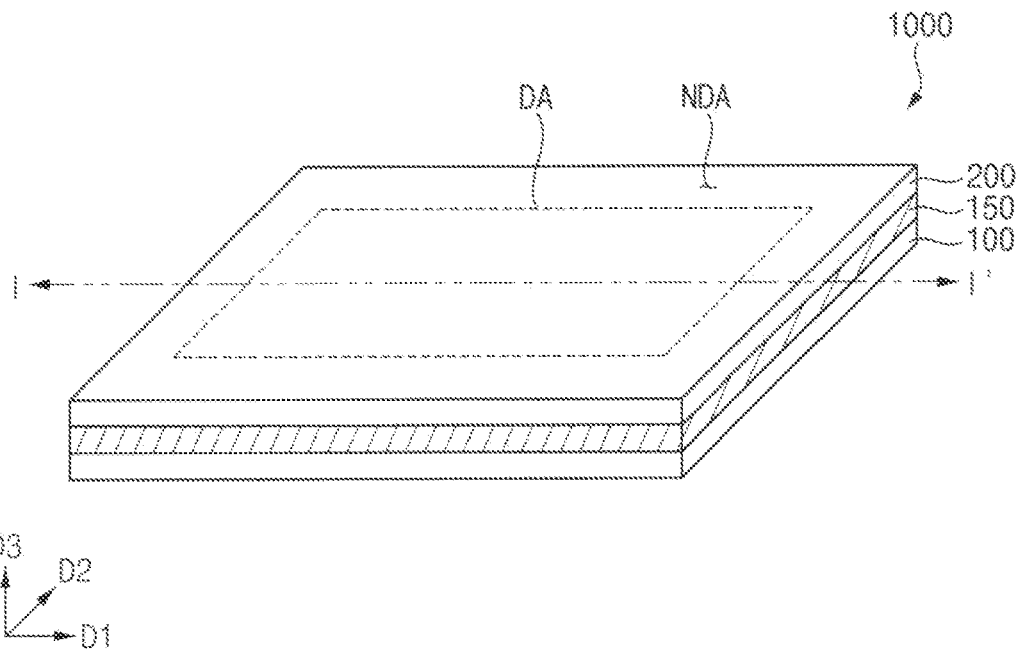
FIG. 1 is a perspective view illustrating a display device according to embodiment.

Hereinafter, embodiments of the present disclosure will be explained in detail with reference to the accompanying drawings. The same reference numerals are used for the same components in the drawings, and redundant descriptions of the same components will be omitted.

Figure 2:
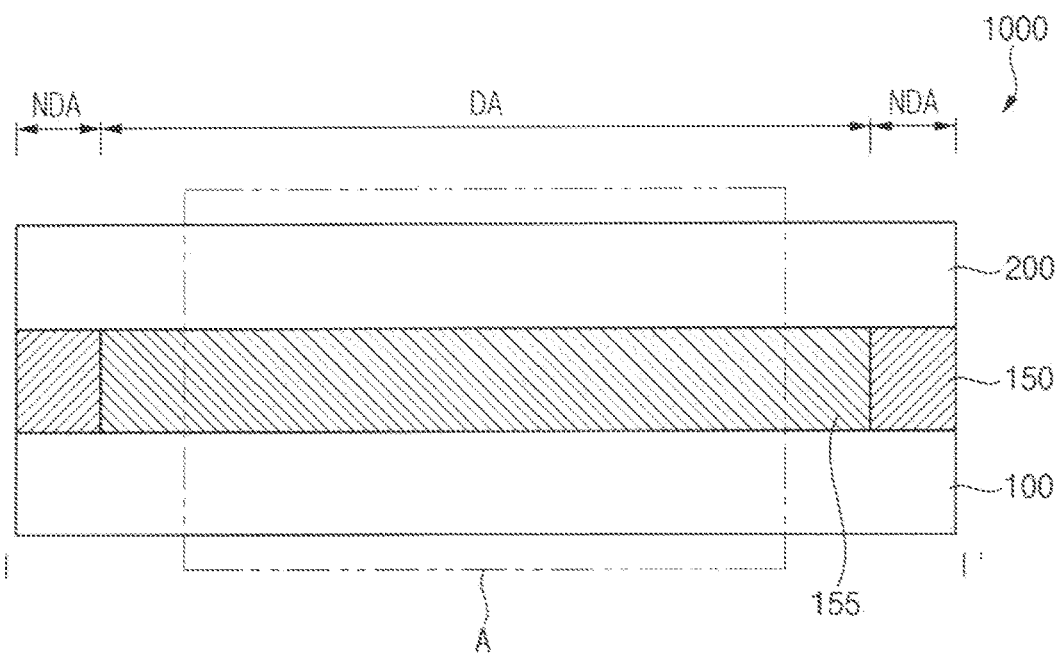
FIG. 2 is a cross-sectional view taken along line I-I' of FIG. 1.

FIG. 1 is a perspective view illustrating a display device according to embodiment. FIG. 2 is a cross-sectional view taken along line I-I' of FIG. 1.

Referring to FIGS. 1 and 2, the display device 1000 may include a display substrate 100, a sealing portion 150, a filling layer 155, and a color conversion substrate 200.

In a plan view, the display device 100 may have a rectangular shape. For example, the display device 100 may include two first sides extending in a first direction D1 and two second sides extending in a second direction D2 intersecting the first direction D1.

The display device 1000 may be divided into a display area DA and a non-display area NDA. The display area DA may be defined as an area that displays an image. The non-display area NDA may be defined as an area that does not display an image. The non-display area NDA may be positioned around the display area DA. For example, the non-display area NDA may surround at least a portion of the display area DA.

The display substrate 100 may include a base substrate, a plurality of insulating layers, a conductive layer, an element for displaying an image, and the like. For example, the element may include a driving element, an emission element, and the like. A detailed description of the display substrate 100 will be described later.

The color conversion substrate 200 may be disposed on the display substrate 100. The color conversion substrate 200 may face the display substrate 100. As will be described later, the color conversion substrate 200 may include a color conversion pattern for converting the color of the incident light. A detailed description of the color conversion substrate 200 will be described later.

The sealing portion 150 may be disposed between the display substrate 100 and the color conversion substrate 200 in the non-display area NDA. The sealing portion 150 may be disposed along the edges of the display substrate 100 and the color conversion substrate 200 in the non-display area NDA to surround the display area DA in a plan view. In addition, the display substrate 100 and the color conversion substrate 200 may be coupled to each other through the sealing portion 150. The sealing portion 150 may include an organic material. For example, the sealing portion 150 may include an epoxy-based resin, and the like.

The filling layer 155 may be disposed between the display substrate 100 and the color conversion substrate 200. Specifically, the filling layer 155 may fill between the display substrate 100 and the color conversion substrate 200. The filling layer 155 may include a material capable of transmitting light. For example, the filling layer 155 may include an organic material. Examples of the material that can be included in the filing layer 155 may be a silicone-based resin, an epoxy-based resin, and the like. These may be used alone or in combination with each other. In another embodiment, the filing layer 155 may be omitted.

However, although the display device 1000 of the present invention is limited to an organic light emitting display device ("OLED"), the configuration of the present invention is not limited thereto. In another embodiment, the display device 1000 may include a liquid crystal display device ("LCD"), a field emission display device ("FED"), a plasma display device ("PDP"), or electrophoretic display device ("EPD"). Hereinafter, an example in which the display device 1000 according to the present invention includes the organic light emitting display device will be described.

Figure 3:
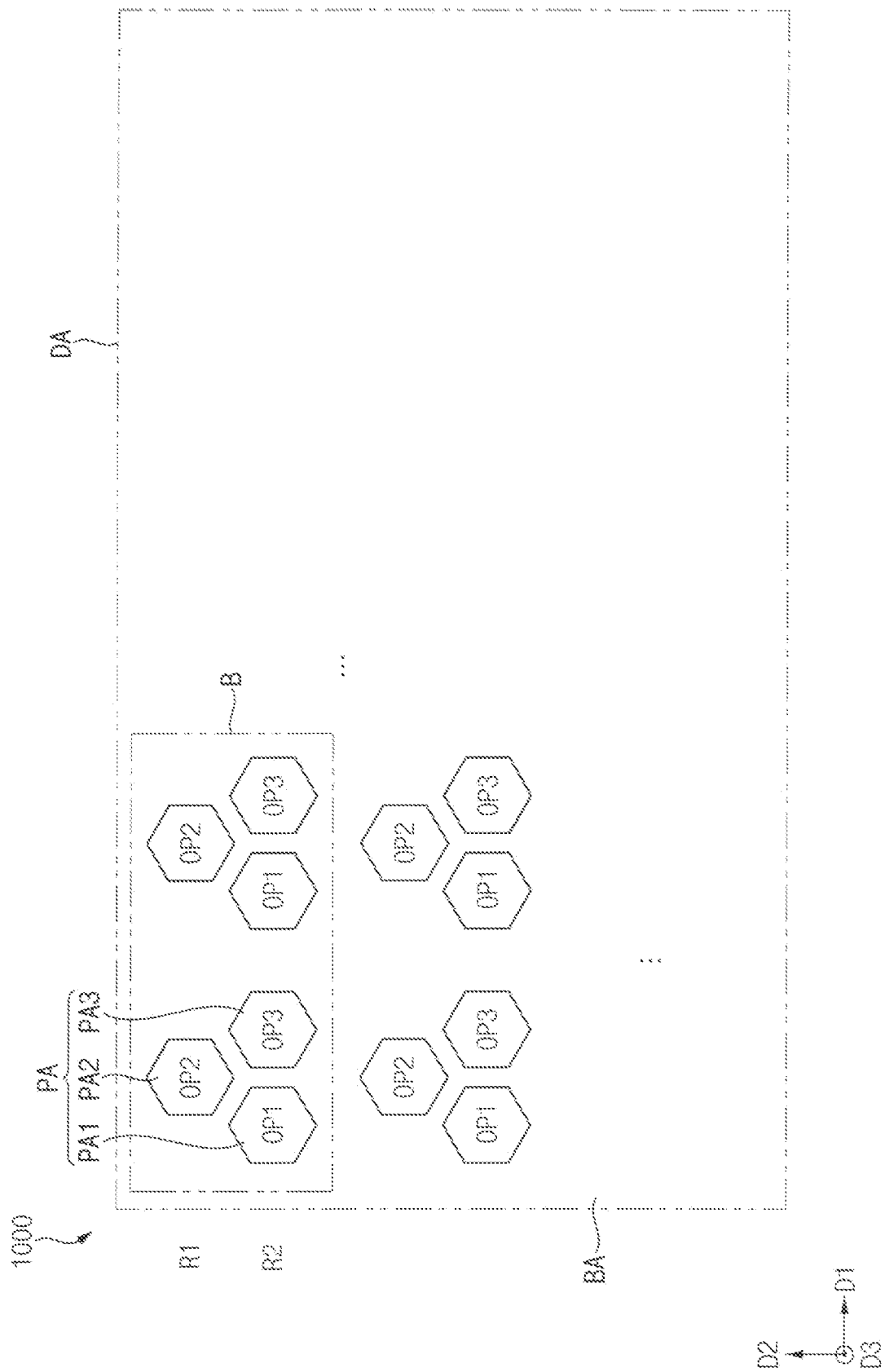
FIG. 3 is a plan view illustrating a display area of the display device of FIGS. 1 and 2.

FIG. 3 is a plan view illustrating a display area of the display device of FIGS. 1 and 2.

Referring to FIG. 3, the display area DA of the display device 1000 may include a first pixel area PA1, a second pixel area PA2, a third area PA3, and a light blocking area BA. That is, the first pixel area PA1, the second pixel area PA2, the third area PA3 and the light blocking area BA may be defined as the display area DA.

Each of the first to third pixel areas PA1, PA2, and PA3 may be an area in which light generated by a emission element is emitted to the outside of the display device 1000. Specifically, the first pixel area PA1 may emit a first light, the second pixel area PA2 may emit a second light, and the third pixel area PA3 may emit a third light. In an embodiment, the first light may be a red light, the second light may be a green light, and the third light may be a blue light. In this case, the first pixel area PA may be a red pixel area, the second pixel area PA2 may be a green pixel area, and the third pixel area PA3 may be a blue pixel area.

The first pixel area PA1, the second pixel area PA2, the third pixel area PA3 may form one pixel area PA. In this case, the pixel area PA may emit a light in which the first light, the second light, and the third light are mixed.

The first to third pixel areas PA1, PA2, and PA3 may be spaced apart from each other. In an embodiment, the second pixel area PA2 may be spaced apart from the first pixel area PA1 by a first interval. The third pixel area PA3 may be spaced apart from the first pixel area PA1 by a second interval smaller than the first interval. The third area PA3 may be spaced apart from the second pixel area PA2 by a third interval larger than the second interval. A detailed description of the first to third intervals is described below.

In a plan view, each of the first to third pixel areas PA1, PA2, and PA3 may be repeatedly arranged in a row direction and a column direction. Specifically, in a plan view, on pixel area PA may be repeatedly arranged in a first direction D1 and a second direction D2 intersecting the first direction D1. In an embodiment, in a plan view, the second pixel area PA2 may be repeatedly arranged in the first row R1 of the display area DA, and the first pixel area PA1 and the third pixel area PA2 may be alternately arranged in the second row R2 of the display area DA with the second pixel area PA2 interposed therebetween.

In a plan view, first to third virtual lines connecting a center of each of the first to third pixel areas PA1, PA2, and PA3 may have a triangular shape. In an embodiment, the first to third virtual lines connecting a center of each of the first to third pixel areas PA1, PA2, and PA3 may have an isosceles triangle shape. For example, a length of the first virtual line connecting the center of the first pixel area PA1 and the center of the second pixel area PA2 may be the same as a length of the second virtual line connecting the center of the second pixel area PA2 and the center of the third pixel area PA3. A detailed description of the first to third virtual lines is described below.

In an embodiment, an area of the third pixel area PA3 may be smaller than an area of each of the first pixel area PA1 and the second pixel area PA2. However, the configuration of the present invention is not limited thereto. For example, the area of the third pixel area PA3 may be larger than the area of each of the first pixel area PA1 and the second pixel area PA2.

The light blocking area BA may be positioned between the first pixel area PA1, the second pixel area PA2, and the third pixel area PA3. For example, in a plan view, the light blocking area BA may surround the first pixel area PA1, the second pixel area PA2, and the third pixel area PA3. The light blocking area BA may not emit light.

In a plan view, each of the first to third pixel areas PA1, PA2, and PA3 may have a triangular shape, a quadrangular shape, a polygonal shape, a circular shape, a track shape, an oval shape, and the like. For example, in a plan view, each of the first to third pixel areas PA1, PA2, and PA3 may have a hexagonal shape. In an embodiment, in a plan view, each of the first to third pixel areas PA1, PA2, and PA3 may have a regular hexagonal shape.

Figure 4:
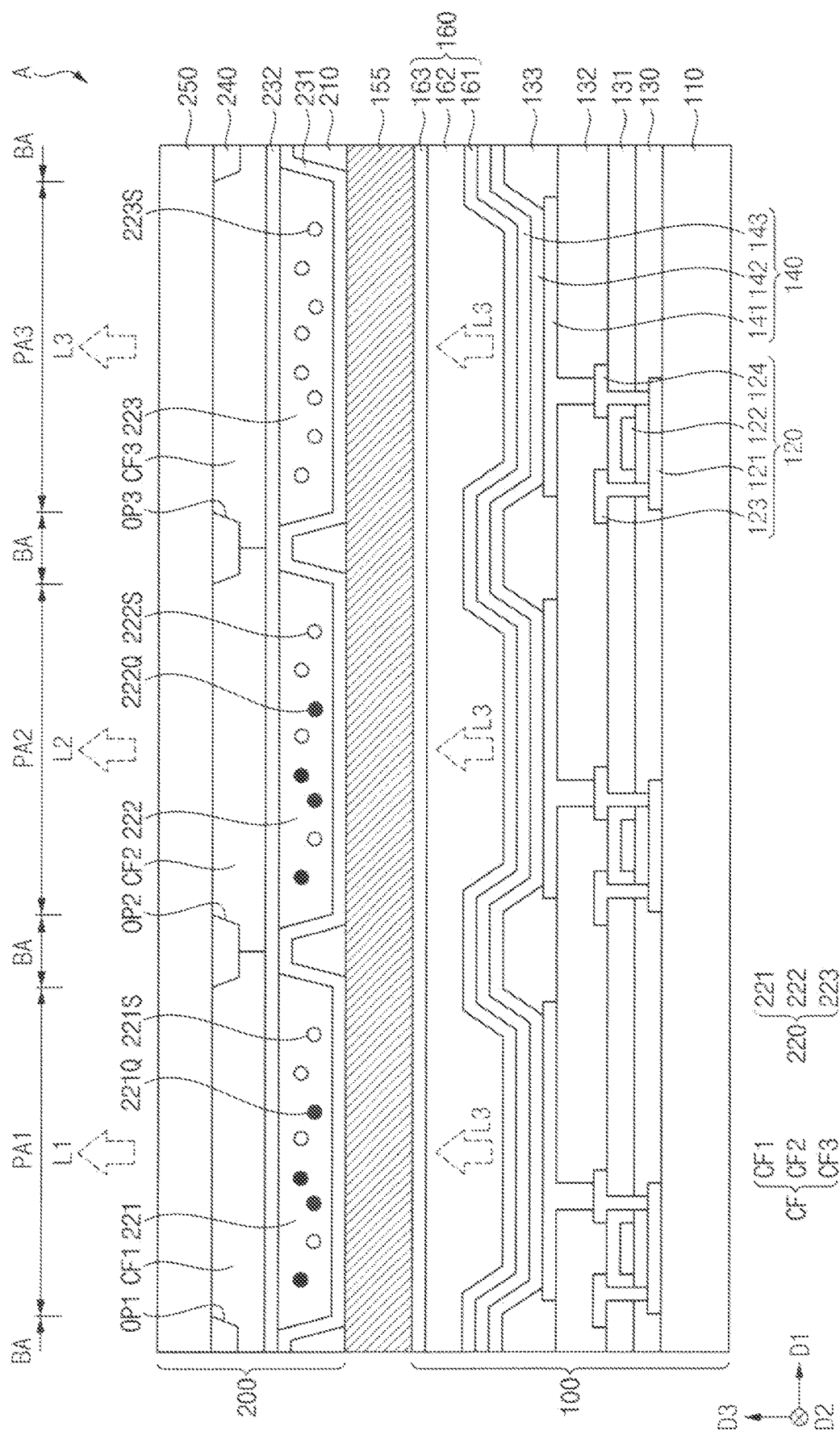
FIG. 4 is an enlarged cross-sectional view of area "A" of FIG. 2.

FIG. 4 is an enlarged cross-sectional view of area "A" of FIG. 2. For example, FIG. 4 is an enlarged cross-sectional view of a portion of the display area DA of the display device 1000 of FIG. 2.

Referring to FIGS. 3 and 4, the light blocking layer 240 may be disposed in the light blocking area BA. The light blocking layer 240 may include a first opening OP1, a second opening OP2, and a third opening OP3. The first opening OP1 may overlap the first pixel area PA1, the second opening OP2 may overlap the second pixel area PA2, and the third opening OP3 may overlap the third pixel area PA3. In an embodiment, the second opening OP2 may be spaced apart from the first opening OP1 by the first interval. The third opening OP3 may be spaced apart from the first opening OP1 by the second interval smaller than the first interval. The third opening OP3 may be spaced apart from the second opening OP2 by the third interval larger than the second interval.

Referring to the plan view of FIG. 3, each of the first to third openings OP1, OP2, and OP3 may have a triangular shape, a rectangular shape, a polygonal shape, a circular shape, a track shape, an oval shape, and the like. For example, in a plan view, each of the first to third openings OP1, OP2, and OP3 may have a hexagonal shape. In an embodiment, each of the first to third openings OP1, OP2, and OP3 may have a regular hexagonal shape.

In the plan view, each of the first to third openings OP1, OP2, and OP3 may be repeatedly arranged in a row direction and a column direction. In an embodiment, in a plan view, the second OP2 may be repeatedly arranged in the first row R1 of the display area DA. The first opening OP1 and the third opening OP3 may be repeatedly arranged in the second row R2 of the display area DA with the second opening OP2 interposed therebetween.

Referring to FIGS. 2 and 4, the display device 1000 may include the display substrate 100, the filling layer 155, and the color conversion substrate 200. The display substrate 100 may include a first base substrate 110, a driving element 120, a gate insulating layer 130, an interlayer insulating layer 131, a planarization player 132, an emission element 140, a pixel defining layer 133, and an encapsulation layer 160. The color conversion substrate 200 may include a bank layer 210, first and second passivation layers 231 and 232, a color conversion layer 220, a color filter layer CF, a light blocking layer 240, and a second base substrate 250.

As described above, the display area DA of the display device 1000 may include the first to third pixel areas PA1, PA2, and PA3 and the light blocking area BA. Accordingly, first to third pixel areas PA1, PA2, and PA3 and the light blocking area BA may be defined at the first base substrate 110.

The first base substrate 110 may include a transparent or opaque material. The first base substrate 110 may be formed of a transparent resin substrate. An example of the transparent resin substrate that can be used as the first base substrate 110 may be a polyimide substrate. In this case, the polyimide substrate may include a first polyimide layer, a barrier film layer, a second polyimide layer, and the like. In another embodiment, the first base substrate 110 may include a quartz substrate, a synthetic quartz substrate, a calcium fluoride substrate, or a fluorine-doped quartz substrate, a soda-lime glass substrate, a non-alkali glass substrate, and the like. These may be used alone or in combination with each other.

An active pattern 121 may be disposed on the first base substrate 110. The active pattern 121 may include a metal oxide semiconductor, an inorganic semiconductor, or an organic semiconductor. The active pattern 121 may have a source region, a drain region, and a channel region. The channel region may be positioned between the source region and the drain region.

A gate insulating layer 130 may be disposed on the first base substrate 110. The gate insulating layer 130 may cover the active pattern 121. The gate insulating layer 130 may include a silicon compound, a metal oxide, and the like. Examples of the silicon compound that can be used for the gate insulating layer 130 may be silicon oxide ($SiO_x$), silicon nitride ($SiN_x$), silicon carbide ($SiC_x$), silicon oxycarbide ($SiO_xC_y$), silicon oxynitride ($SiO_xN_y$), silicon carbonitride ($SiC_xN_y$), and the like. In addition, examples of the metal oxide that can be used for the gate insulating layer 130 may be aluminum oxide (AlO), aluminum nitride (AlN), tantalum oxide (TaO), hafnium oxide (HfO), zirconium oxide (ZrO), titanium oxide. (TiO), and the like. These may be used alone or in combination with each other.

A gate pattern 122 may be disposed on the gate insulating layer 130. The gate pattern 122 may overlap the channel region of the active pattern 121. The gate pattern 122 may include a metal, an alloy, a metal nitride, a conductive metal oxide, a transparent conductive material, and the like. Examples of the metal that can be used for the gate pattern 122 may be copper (Cu), molybdenum (Mo), titanium (Ti), aluminum (Al), and the like. These may be used alone or in combination with each other.

The interlayer insulating layer 131 may be disposed on the gate insulating layer 130. The interlayer insulating layer 131 may cover the gate pattern 122. The interlayer insulating layer 131 may include a silicon compound, a metal oxide, and the like. Examples of the silicon compound that can be used for the interlayer insulating layer 131 may be silicon oxide, silicon nitride, and the like. In addition, examples of the metal oxide that can be used for the interlayer insulating layer 131 may be aluminum oxide, hafnium oxide, zirconium oxide, and the like. These may be used alone or in combination with each other.

A source pattern 123 and a drain pattern 124 may be disposed on the interlayer insulating layer 131. Each of the source pattern 123 and the drain pattern 124 may be connected to the source region and the drain region of the active pattern 121 through a contact hole formed by removing a portion of the gate insulating layer 130 and the interlayer insulating layer 131. Each of the source pattern 123 and the drain pattern 124 may include a metal, an alloy, a metal nitride, a conductive metal oxide, a transparent conductive material, and the like. Examples of the metal that can be used for each of the source pattern 123 and the drain pattern 124 may be copper (Cu), molybdenum (Mo), titanium (Ti), aluminum (Al), and the like. These may be used alone or in combination with each other.

The active pattern 121, the gate pattern 122, the source pattern 123, and the drain pattern 124 may form the driving element 120. The driving element 120 may be disposed in each of the first pixel area PA1, the second pixel area PA2, and the third pixel area PA3.

The planarization layer 132 may be disposed on the interlayer insulating layer 131. The planarization layer 132 may cover the source pattern 123 and the drain pattern 124. The planarization layer 132 may include an organic material or an inorganic material. In an embodiment, the planarization layer 132 may include an organic material. Examples of the organic material that can be used for the planarization layer 132 may be a photoresist, a polyacryl-based resin, a polyimide-based resin, a polyamide-based resin, a siloxane-based resin, acryl-based resin, epoxy-based resin, and the like. These may be used alone or in combination with each other.

A lower electrode 141 may be disposed on the planarization layer 132. The lower electrode 141 may be connected to the drain electrode 124 through a contact hole formed by removing a portion of the planarization layer 132. The lower electrode 141 may include a metal, an alloy, a metal nitride, a conductive metal oxide, a transparent conductive material, and the like. These may be used alone or in combination with each other. For example, the lower electrode 141 may be an anode electrode.

The pixel defining layer 133 may be disposed on the planarization layer 132 and the lower electrode 141. The pixel defining layer 133 may cover both sides of the lower electrode 141 and expose a portion of an upper surface of the lower electrode 141. The pixel defining layer 133 may include an organic material or an inorganic material. In an embodiment, the pixel defining layer 133 may include an organic material. Examples of the organic material that can be used for the pixel defining layer 133 may be photoresist, polyacrylic resin, polyimide-based resin, polyamide-based resin, siloxane-based resin, acrylic-based resin, epoxy-based resin, and the like. These may be used alone or in combination with each other.

An emission layer 142 may be disposed on the lower electrode 141 and the pixel defining layer 133. Holes provided from the lower electrode 141 and electrons provided from an upper electrode 143 combine in the emission layer 142 to form excitons, and as the excitons change from an excited state to a ground state, the emission layer 142 may emit light. For example, the emission layer 142 may emit a third light L3. In an embodiment, the third light L3 may be a blue light.

The upper electrode 143 may be disposed on the emission layer 142. The upper electrode 143 may include a metal, an alloy, a metal nitride, a conductive metal oxide, a transparent conductive material, and the like. These may be used alone or in combination with each other. For example, the upper electrode 143 may be a cathode electrode.

The lower electrode 141, the emission layer 142, and the upper electrode 143 may form the emission element 140. The emission element 140 may be disposed in each of the first pixel area PA1, the second pixel area PA2, and the third pixel area PA3. As described above, the emission layer 142 may emit blue light. In this case, the emission element 140 may include a blue emission element emitting blue light.

The encapsulation layer 160 may be disposed on the upper electrode 143. The encapsulation layer 160 may prevent impurities, moisture, etc. from penetrating into the emission element 140 from the outside. The encapsulation layer 160 may include at least one inorganic encapsulation layer and at least one organic encapsulation layer. For example, the encapsulation layer 160 may include a first inorganic encapsulation layer 161, a second inorganic encapsulation layer 163 disposed on the first inorganic encapsulation layer 161, and an organic encapsulation layer 162 disposed between the first inorganic encapsulation layer 161 and the second inorganic encapsulation layers 163.

The filling layer 155 may be disposed on the encapsulation layer 160. The filling layer 155 may be disposed between the display substrate 100 and the color conversion substrate 200. Specifically, the filling layer 155 may be disposed between the encapsulation layer 160 and the first passivation layer 231. For example, the filling layer 155 may directly contact the first passivation layer 231.

The bank layer 210 may be disposed in the light blocking area BA on the filling layer 155. The bank layer 210 may block light incident to the bank layer 210. Accordingly, the bank layer 210 may prevent color mixing between the first pixel area PA1, the second pixel area PA2, and the third pixel area PA3. For example, the bank layer 210 may include an organic material.

The present invention may be applied to a display device and an electronic device including the same. For example, the present invention may be applied to high-resolution smartphones, mobile phones, smart pads, smart watches, tablet PCs, vehicle navigation systems, televisions, computer monitors, computers, and the like.

The first passivation layer 231 may be disposed on the encapsulation layer 160. The first passivation layer 231 may cover the bank layer 210. The first passivation layer 231 may prevent impurities such as moisture, air, etc. from penetrating into the color filter layer CF and the color conversion layer 220 from the outside. For example, the first passivation layer 231 may include silicon oxide, silicon nitride, silicon oxynitride, and the like. These may be used alone or in combination with each other.

The color conversion layer 220 may be disposed on the first passivation layer 231. The color conversion layer 220 may include a first color conversion pattern 221, a second color conversion pattern 222, and a light transmission pattern 223. The first color conversion pattern 221 may be disposed in the first pixel area PA1, the second color conversion pattern 222 may be disposed in the second pixel area PA2, and the light transmission pattern 223 may be disposed in the third pixel area PA3. For example, the bank layer 210 may be disposed between the first color conversion pattern 221, the second color conversion pattern 222, and the light transmission pattern 223. The first color conversion pattern 221 may convert light incident on the first color conversion pattern 221 into a first light L1. In an embodiment, the first color conversion pattern 221 may convert the third light L3 into the first light L1. The first color conversion pattern 221 may include a red phosphor. The red phosphor may include at least one of (Ca, Sr, Ba)S, $(Ca, Sr, Ba)_2Si_5N_8$, $(CaAlSiN_3)$, $CaMoO_4$, and $Eu_2Si_5N_8$. In addition, the first color conversion pattern 221 may include a quantum dot 221Q. The quantum dot 221Q may convert the third light L3 into the first light L1. The first color conversion pattern 221 may further include a scatterer 221S. The scatterer 221S may scatter light incident on the first color conversion pattern 221 in various directions. The scatterer 221S may be a metal oxide particle or an organic particle. Examples of the metal oxide particle may be titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of the organic particle may be acrylic resin, urethane resin, and the like.

The second color conversion pattern 222 may convert light incident on the second color conversion pattern 222 into a second light L2. In an embodiment, the second color conversion pattern 222 may convert the third light L3 into the second light L2. The second color conversion pattern 222 may include a green phosphor. The green phosphor may include at least one of yttrium aluminum garnet ("YAG"), $(Ca, Sr, Ba)_2SiO_4$, $SrGa_2S_4$, barium magnesium aluminate ("BAM"), alpha sialon ("α-SiAlON"), beta sialon ("β-SiAlON"), $Ca_3Sc_2Si_3O_{12}$, $Tb_3Al_5O_{12}$, $BaSiO_4$, CaAlSiON, and $(Sr_{1-x}Ba_x)Si_2O_2N_2$. In this case, the x in $(Sr_{1-x}Ba_x)Si_2O_2N_2$ may be any number between 0 and 1. In addition, the second color conversion pattern 222 may include a quantum dot 222Q. The quantum dot 222Q may convert the third light L3 into the second light L2. The second color conversion pattern 222 may further include a scatterer 222S. The scatterer 222S may scatter light incident on the second color conversion pattern 222 in various directions. The scatterer 222S included in the second color conversion pattern 222 may be substantially the same as the scatterer 221S included in the first color conversion pattern 221.

The light transmission pattern 223 may convert light incident on the light transmission pattern 223 into the third light L3. In an embodiment, the light transmission pattern 223 may transmit the third light L3. The light transmission pattern 223 may include a transparent polymer material. In addition, the light transmission pattern 223 may include a scatterer 223S. The scatterer 223S may scatter light incident on the light transmission pattern 223 in various directions. The scatterer 223S included in the light transmission pattern 223 may be substantially the same as the scatterer 221S included in the first color conversion pattern 221 and the scatterer 222S included in the second color conversion pattern 222.

The second passivation layer 232 may be disposed on the color conversion layer 220. The second passivation layer 232 may prevent impurities such as moisture and air from penetrating into the color filter layer CF and the color conversion layer 220 from the outside. The second passivation layer 232 may include silicon oxide, silicon nitride, silicon oxynitride, and the like. These may be used alone or in combination with each other.

The color filter layer CF may be disposed on the second passivation layer 232. The color filter layer CF may include a first color filter CF1, a second color filter CF2, and a third color filter CF3. The first color filter CF1 may be disposed on the first color conversion pattern 221, the second color filter CF2 may be disposed on the second color conversion pattern 222, and the third color filter CF3 may be disposed on the light transmission pattern 223.

The color filter layer CF may transmit light of a partial wavelength band incident to the color filter layer CF and may block light of other wavelength bands incident on the color filter layer CF. For example, the first color filter CF1 may transmit the first light L1 and block the second light L2 and the third light L3. The second color filter CF2 may transmit the second light L2 and block the first light L1 and the third light L3. The third color filter CF3 may transmit the third light L3 and block the first light L1 and the second light L2.

In an embodiment, the first light L1 may be a red light, the second light L2 may be a green light, and the third light L3 may be a blue light.

The light blocking layer 240 may be disposed in the light blocking area BA on the second passivation layer 232. For example, the light blocking layer 240 may be disposed between the first color filter CF1, the second color filter CF2, and the third color filter CF3. The light blocking layer 240 may block light incident to the light blocking layer 240. Accordingly, the light blocking layer 240 may prevent color mixing between the first pixel area PA1, the second pixel area PA2, and the third pixel area PA3. In an embodiment, the light blocking layer 240 may include the same material as the third color filter CF3.

As described above, the light blocking layer 240 may include a first opening OP1, a second opening OP2, and a third opening OP3. The first opening OP1 may overlap the first pixel area PA1, the second opening OP2 may overlap the second pixel area PA2, and the third opening OP3 may overlap the third pixel area PA3.

The second base substrate 250 may be disposed on the light blocking layer 240 and the color filter layer CF. The second base substrate 250 may include a transparent or opaque material. An example of the second base substrate 250 may be a polyimide substrate. In another embodiment, examples of the second base substrate 250 may be a quartz substrate, a glass substrate, and the like. These may be used alone or in combination with each other. In addition, although not shown in FIG. 4, an insulating layer and the like may be disposed on the second base substrate 250.

Figure 5:
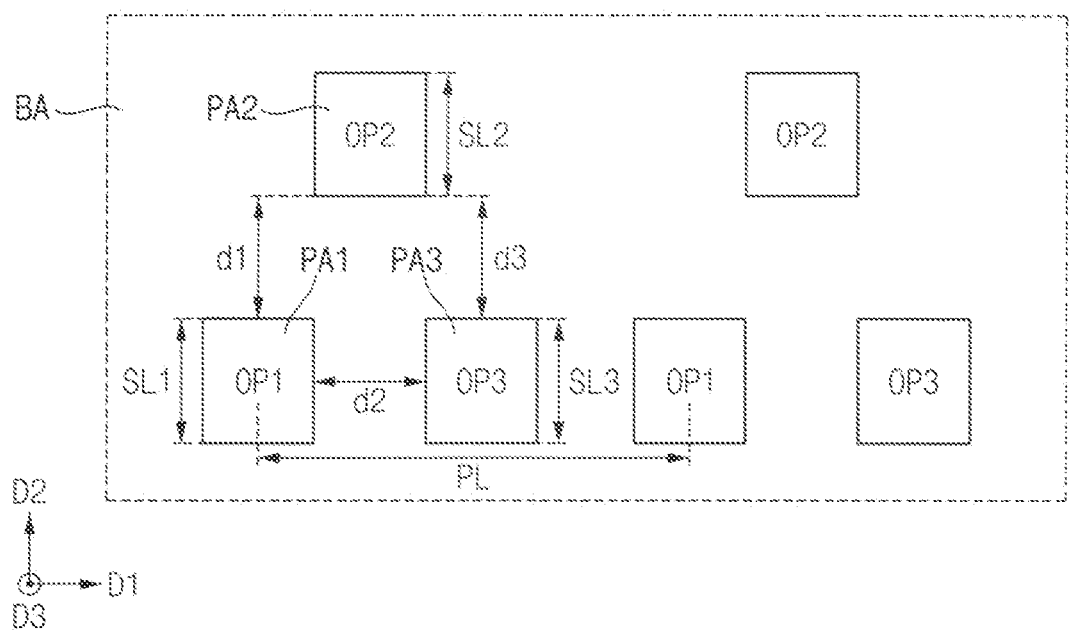
FIG. 5 is an enlarged plan view of first to third pixel areas of a display device according to comparative example.

FIG. 5 is an enlarged plan view of first to third pixel areas of a display device according to comparative example. FIG.

6 is an enlarged plan view of area "B" of FIG. 3. FIG. 7 is a diagram for explaining numerical values of first to third pixel areas of FIG. 6.

First, referring to FIG. 5, in the display device, each of the first to third pixel areas PA1, PA2, and PA3 in which an emission element and a color filter layer are disposed has a rectangular shape. A first length SL1, which is a length of a short side of the first pixel area PA1, is about 126.35 µm, a second length SL2, which is a length of a short side of the second pixel area PA2, is about 126.35 µm, and a third length SL3, which is a length of a short side of the pixel area PA3, is about 113.06 µm. In addition, a first interval d1, which is an interval between the first pixel area PA1 and the second pixel area PA2, is about 59 µm, a second interval d2, which is an interval between the first pixel area PA1 and the third pixel area PA3, is about 66 µm, and a third interval d3, which is an interval between the second pixel area PA2 and the third pixel area PA3, is about 66 µm.

A pixel distance PL, which is a distance between a center of the first pixel area PA1 and a center of the adjacent first pixel area PA1, is about 372 µm. Although not shown in detail in FIG. 5, a distance between a center of the second pixel area PA2 and a center of the adjacent second pixel area PA2 is about 372 µm and a distance between a center of the third pixel area PA3 and a center of the adjacent second pixel area PA3 is about 372 µm.

An area ratio of the first pixel area PA1 and the second pixel area PA2 is about 1:1. An area ratio of the first pixel area PA1 (or the second pixel area PA2) and the third pixel area PA3 is about 1:0.8.

Figure 6:
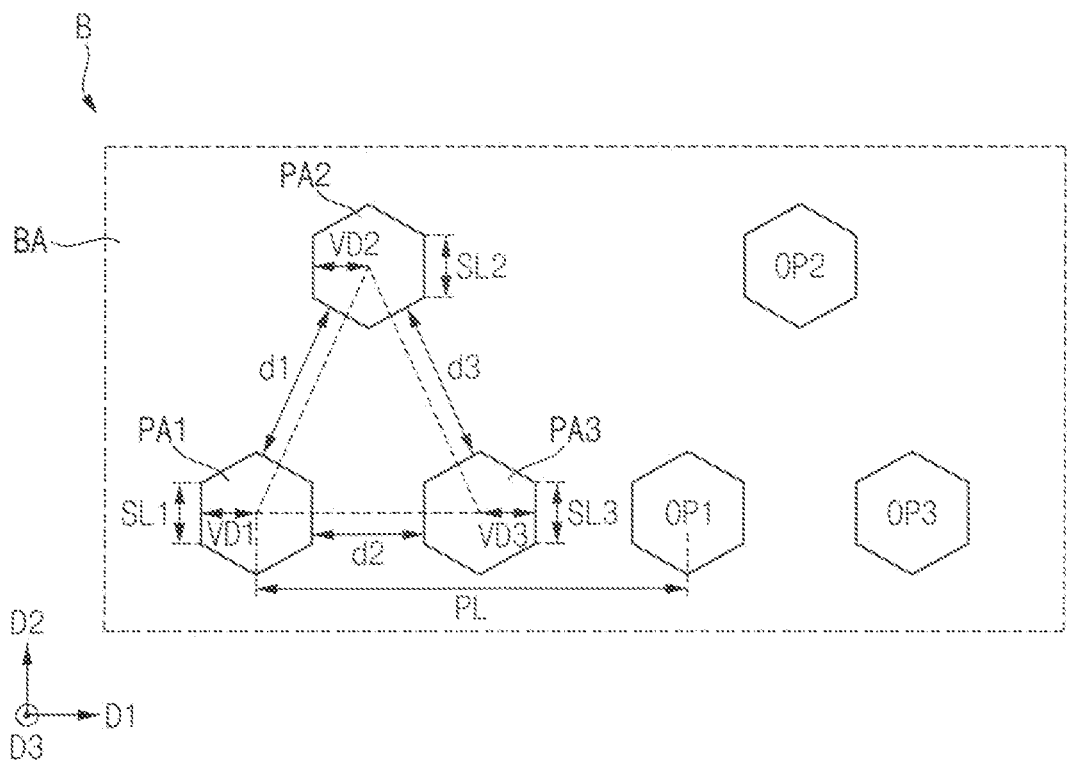
FIG. 6 is an enlarged plan view of area "B" of FIG. 3.

Referring to FIGS. 6 and 7, the area of each of the first to third pixel areas PA1, PA2, and PA3 shown in FIGS. 6 and 7 and the area of each of the first to third pixel areas PA1, PA2, and PA3 shown in FIG. 5 are assumed to have the same area. In addition, the pixel distance PL shown in FIGS. 6 and 7 and the pixel distance PL shown in FIG. 5 are assumed to have the same pixel distance. When the above conditions are satisfied, first to third lengths SL1, SL2, and SL3, first to third vertical distances VD1, VD2, and VD3, and first to third intervals d1, d2, and d3 for the first to third pixel areas PA1, PA2, and PA3 may be calculated.

First, when the above conditions are satisfied, the first length SL1, which is a length of a short side of the first pixel area PA1, is about 78.35 µm, the second length SL2, which is a length of a short side of the second pixel area PA2, is about 78.35 µm, and the third length SL3, which is a length of a short side of the third pixel area PA3, is about 70.2 µm. In addition, the first vertical distance VD1, which is a distance from a center of the first pixel area PA1 to the short side of the first pixel area PA1, is about 67.85 µm, the second vertical distance VD2, which is a distance to the short side of the pixel area PA2, is about 67.85 µm, and the third vertical distance VD3, which is a distance from a center of the third pixel area PA3 to the short side of the third pixel area PA3, is about 60.79 µm.

$$d2 = \frac{PL - 2 \times VD1 - 2 \times VD3}{2} \quad \text{[Equation 1]}$$

The second distance d2 is calculated from the pixel distance PL, the first vertical distance VD1, and the third vertical distance VD3. That is, the second interval d2 is calculated by the equation 1. Through the equation 1, the second interval d2 is calculated to be about 57.36 µm.

$$x2 = \frac{VD1 + d2 + VD3}{2}, y2 = \frac{PL}{2} \quad \text{[Equation 2]}$$

$$x3 = VD1 + d2 + VD3, y3 = 0 \quad \text{[Equation 3]}$$

(x1, y1), which is a first center coordinate C1 of the first pixel area PA1, is (0, 0) is assumed. In this case, a second center coordinate C2 of the second pixel area PA2 is calculated through the equation 2, and a third center coordinate C3 of the third pixel area PA3 is calculated through the equation 3. As a result, (x2, y2), which is the second central coordinate (C2), is calculated as (93, 186), and (x3, y3), which is the third central coordinate (C3), is calculated as (186, 0).

$$ILL1 = \sqrt{(x2-x1)^2 - (y2-y1)^2} \quad \text{[Equation 4]}$$

$$ILL2 = x3 \quad \text{[Equation 5]}$$

$$ILL3 = \sqrt{(x2-x3)^2 - (y2-y3)^2} \quad \text{[Equation 6]}$$

Here, 'ILL1' is a length of a first virtual line IL1 connecting the center of the first pixel area PA1 and the center of the second pixel area PA2, 'ILL2' is a length of a second virtual line IL2 connecting the center of the first pixel area PA1 and the center of the third pixel area PA3, and 'ILL3' is a length of a third virtual line IL3 connecting the center of the second pixel area PA2 and the center of the third pixel area PA3.

The length of the first virtual line IL1 is calculated to be about 207.95 µm through the equation 4, the length of the second virtual line IL2 is calculated to be about 186 µm through the equation 5, and the length of the third virtual line IL3 is calculated to be about 207.95 µm through the equation 6. That is, the length of the first virtual line IL1 and the length of the third virtual line IL3 are the same. Accordingly, as described above, in a plan view, the first to third virtual lines IL1, IL2, and IL3 connecting the center of each of the first, second, and third pixel areas PA1, PA2, and PA3 may have a shape of an isosceles triangle.

$$d1 \approx ILL1 - VD1 - VD2 \quad \text{[Equation 7]}$$

$$d3 \approx ILL3 - VD2 - VD3 \quad \text{[Equation 8]}$$

The first interval d1 and the third interval d3 are predicted from the length of each of the first to third virtual lines IL1, IL2, and IL3 and the first to third vertical distances VD1, VD2, and VD3. The second interval d2 is calculated through the equation 7 and the third interval d3 is calculated through the equation 8. As a result, the first interval d1 is calculated to be about 71.87 µm and the third interval d3 is calculated to be about 78.93 µm.

That is, the second interval d2 is reduced by about 9 µm compared to the second interval d2 described with reference to FIG. 5, the first interval d1 is increased by about 13 µm compared to the first interval d1 described with reference to FIG. 5, and the third interval d3 is increased by about 13 µm compared to the third interval d3 described with reference to FIG. 5. That is, the second interval d2 is smaller than the first interval d1 and smaller than the third interval d3.

As described above, in the display device 1000 of the present invention, the second pixel area PA2 may be spaced apart from the first pixel area PA1 by the first interval d1 and the third pixel area PA3 may be spaced apart from the first pixel area PA1 by the second interval d2 that is smaller than the first interval d1. In addition, the third pixel area PA3 may be spaced apart from the first pixel area PA1 by the third interval d3 that is larger than the second interval d2. In this case, an influence of color mixing from the first pixel area PA1 emitting red light and the third pixel area PA3 emitting blue light may be reduced. Accordingly, a display quality of the display device 1000 may be improved.

The present invention can be applied to various display devices that may include a display device. For example, the present invention can be applied to high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope and spirit of the appended claims.

What is claimed is:

1. A display device comprising:
   a first base substrate in which a first pixel area, a second pixel area spaced apart from the first pixel area by a first interval, a third pixel area spaced from the first pixel area by a second interval smaller than the first interval, the third pixel area spaced from the second pixel area by a third interval larger than the second interval, and a light blocking area surrounding each of the first, second, and third pixel areas are defined;
   first, second, and third emission elements disposed on the first base substrate in the first, second, and third pixel areas, respectively;
   a color conversion layer including a first color conversion pattern, a second color conversion pattern, and a light transmission pattern disposed on the first, second, and third emission elements, respectively; and
   a color filter layer including first, second, and third color filters disposed on the first color conversion pattern, the second color conversion pattern, and the light transmission pattern, respectively.

2. The display device of claim 1, wherein each of the first, second, and third pixel areas is repeatedly arranged in a row direction and a column direction in a plan view.

3. The display device of claim 2, wherein the first, second, and third pixel areas and the light blocking area define a display area,
   wherein the second pixel area is repeatedly arranged in a first row of the display area, and the first pixel area and the third pixel area are alternately arranged in a second row of the display area, and
   wherein the second row is adjacent to the first row.

4. The display device of claim 1, wherein the first pixel area emits a first light, the second pixel area emits a second light having a color different from a color of the first light, and the third pixel area emits a third light having a color different from a color of the first light and a color of the second light.

5. The display device of claim 4, wherein the first light is a red light, the second light is a green light, and the third light is a blue light.

6. The display device of claim 1, wherein each of the first, second, and third pixel areas has a hexagon shape in a plan view.

7. The display device of claim 6, wherein each of the first, second, and third pixel areas has a regular hexagon shape in a plan view.

8. The display device of claim 1, wherein a length of a first virtual line connecting a center of the first pixel area and a center of the second pixel area is a same as a length of a second virtual line connecting a center of the second pixel area and a center of the third pixel area.

9. The display device of claim 1, first to third virtual lines connecting a center of each of the first, second, and third pixel areas have a triangular shape in a plan view.

10. The display device of claim 9, wherein the first to third virtual lines connecting a center of each of the first, second, and third pixel areas have an isosceles triangle shape in a plan view.

11. The display device of claim 1, further comprising:
    a filling layer disposed between the emission element and the color conversion layer; and
    a second base substrate disposed on the color filter layer.

12. The display device of claim 11, further comprising:
    a light blocking layer disposed in the light blocking area between the color conversion layer and the second base substrate.

13. The display device of claim 11, further comprising:
    a bank layer disposed in the light blocking area between the first color conversion pattern, the second color conversion pattern, and the light transmission pattern on the filing layer.

14. The display device of claim 1, wherein the first, second, and third emission elements include a blue emission element emitting a blue light.

15. The display device of claim 1, wherein an area of the third pixel area is smaller than an area of each of the first and second pixel areas.

16. A display device comprising:
    a base substrate in which a first pixel area, a second pixel area, a third pixel area, and a light blocking area surrounding each of the first, second, and third pixel areas are defined;
    first, second, and third emission elements disposed on the base substrate in the first, second, and third pixel areas;
    a color conversion layer including a first color conversion pattern, a second color conversion pattern, and a light transmission pattern disposed on the first, second, and third emission elements, respectively;
    a color filter layer including first to third color filters disposed on each of the first color conversion pattern, the second color conversion pattern, and the light transmission pattern; and
    a light blocking layer disposed in the light blocking area between the first to third color filters and including a first opening overlapping the first pixel area, a second opening overlapping the second pixel area and spaced apart from the first opening by a first interval, and a third opening overlapping the third pixel area and spaced apart from the first opening by a second interval smaller than the first interval, the third opening spaced apart from the second opening by a third interval larger than the second interval.

17. The display device of claim 16, wherein the first, second, and third pixel areas and the light blocking area define a display area,
    wherein the second opening is repeatedly arranged in a first row of the display area, and the first opening and the third opening are alternately arranged in a second row of the display area, and wherein the second row is adjacent to the first row.

18. The display device of claim 16, wherein the first pixel area emits a red light, the second pixel area emits a green light, and the third pixel area emits a blue light.

19. The display device of claim 16, wherein each of the first, second, and third openings has a regular hexagon shape in a plan view.

20. The display device of claim 16, wherein the first, second, and third emission elements include a blue emission element emitting a blue light.

* * * * *